(12) United States Patent
Takamine et al.

(10) Patent No.: US 6,781,485 B2
(45) Date of Patent: Aug. 24, 2004

(54) SURFACE ACOUSTIC WAVE FILTER

(75) Inventors: Yuichi Takamine, Kanazawa (JP); Minefumi Ouchi, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/230,061

(22) Filed: Aug. 29, 2002

(65) Prior Publication Data

US 2003/0042999 A1 Mar. 6, 2003

(30) Foreign Application Priority Data

Aug. 29, 2001 (JP) ........................................ 2001-260147

(51) Int. Cl.[7] ................................................. H03H 9/00
(52) U.S. Cl. ..................... 333/195; 333/193; 310/313 R
(58) Field of Search .............................. 333/193, 195, 333/133, 202; 310/313 A, 313 B, 313 R, 311, 313 D (56) References Cited

U.S. PATENT DOCUMENTS 5,568,002 A * 10/1996 Kawakatsu et al. ..... 310/313 B
6,255,915 B1 * 7/2001 Edmonson ................... 333/193
2001/0054942 A1 * 12/2001 Takamine et al. ............ 333/195
2002/0021195 A1 * 2/2002 Takamine .................... 333/195
2003/0035555 A1 * 2/2003 Takamine et al. ........... 381/111
2003/0146805 A1 * 8/2003 Sawada ....................... 333/133

FOREIGN PATENT DOCUMENTS

CN 1165433 11/1997
JP 2000-004142 1/2000

* cited by examiner

Primary Examiner—Brian Young
Assistant Examiner—John B Nguyen
(74) Attorney, Agent, or Firm—Keating & Bennett, LLP (57) ABSTRACT

A surface acoustic wave filter unit having three interdigital transducers arranged along the surface acoustic wave propagation direction is disposed on a piezoelectric substrate. An unbalanced signal terminal and balanced signal terminals are provided for the surface acoustic wave filter unit. At least one of the three interdigital transducers is out of phase relative to the other interdigital transducers. Reflectors are arranged so as to sandwich the three interdigital transducers therebetween. The reflectors are grounded. Thus, a surface acoustic wave filter having a balance-to-unbalance conversion function and having high balance between the balanced signal terminals is achieved.

21 Claims, 12 Drawing Sheets

SURFACE ACOUSTIC WAVE FILTER

BACKGROUND OF THE INVENTION

1. Field of the Invention

The present invention relates to a surface acoustic wave filter having a balance-to-unbalance conversion function.

2. Description of the Related Art

Recently, there has been significant technological progress in reducing the size and weight of cellular telephones. In order to achieve this, in addition to reducing the number and size of components, multi-function components are being increasingly developed. In view of such a background, recent research has been actively conducted on surface acoustic wave (SAW) filters having a balance-to-unbalance conversion function, i.e., a so-called "balun" function, which are for use in, for example, in the RF (radio frequency) stage of cellular telephones. Such SAW filters are used mostly for GSM (global system for mobile communications) compliant devices.

If a balanced line such as a twin lead feeder is directly coupled to an unbalanced line such as a coaxial cable, an unbalanced current flows, thereby, undesirably, causing the feeder itself to operate as an antenna. A circuit called a balun is thus required for preventing the unbalanced current in order to match the balanced line to the unbalanced line.

Figure 12:
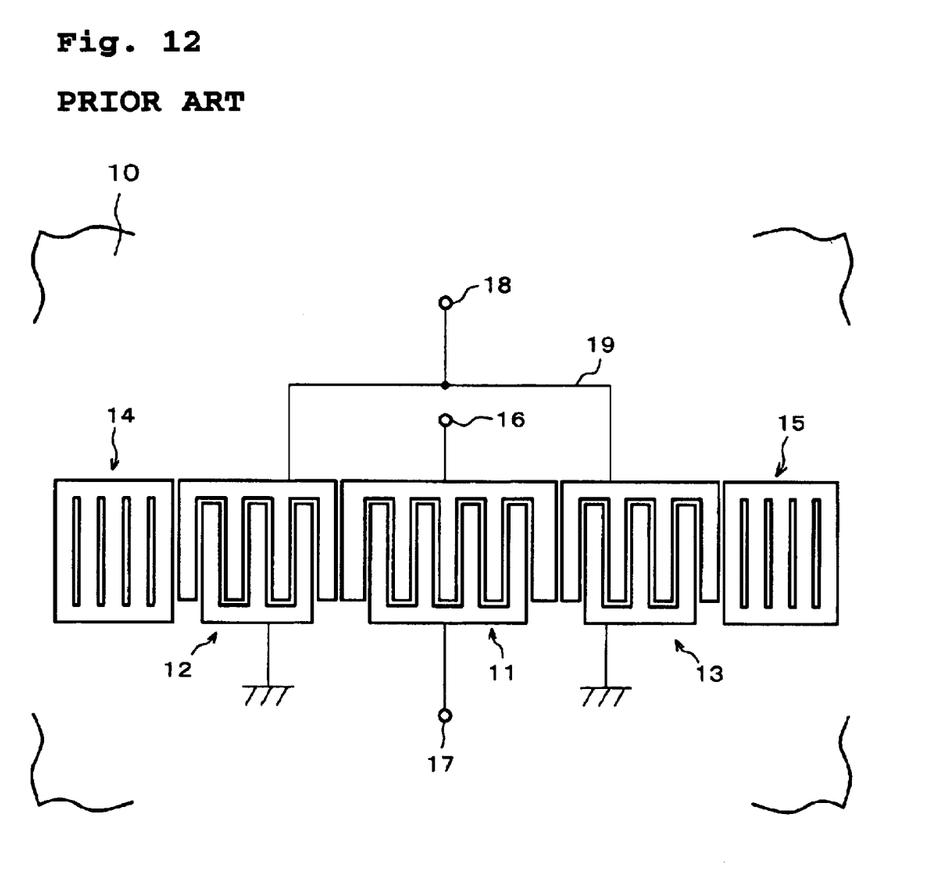
FIG. 12 is a schematic diagram of a SAW filter in the related art.

Many patent applications pertaining to SAW filters having a balance-to-unbalance conversion function have been filed. A well-known SAW filter having a balance-to-unbalance conversion function is illustrated in FIG. 12.

In the SAW filter shown in FIG. 12, a comb-like electrode (also called an interdigital transducer, hereinafter referred to as an "IDT") 11 is disposed on a piezoelectric substrate 10. IDTs 12 and 13 are positioned on the left and right sides of the IDT 101, respectively, in the surface acoustic wave (SAW) propagation direction.

Reflectors 14 and 15 for reflecting a surface acoustic wave in order to improve the conversion efficiency are further arranged in the SAW filter in such a manner that they sandwich the IDTs 11, 12, and 13 therebetween from the left and right. The SAW filter further includes balanced signal terminals 16 and 17, and an unbalanced signal terminal 18.

The SAW filter of this type is called a three-IDT longitudinally coupled resonator SAW filter having a balance-to-unbalance conversion function by performing conversion between the IDTs 11, 12, and 13 using a surface acoustic wave.

In a SAW filter having a balance-to-unbalance conversion function, it is required that the transmission characteristics in the pass band between an unbalanced signal terminal and each balanced signal terminal have amplitude characteristics as equal as possible and 180°-out-of-phase characteristics as much as possible. The amplitude characteristic and the phase characteristic are referred to as "amplitude balance" and "phase balance", respectively.

The amplitude balance and the phase balance are defined as follows. If the SAW filter having a balance-to-unbalance conversion function is a three-port device consisting of, for example, a first port corresponding to an unbalanced input terminal and second and third ports corresponding to balanced output terminals, the amplitude balance=A, where $A=||20 \log(S21)|-|20 \log(S31)||$, and the phase balance=B−180, where $B=|\angle S21-\angle S31|$. In the above equations, S21 denotes the transfer coefficient from the first port to the second port, S31 denotes the transfer coefficient from the first port to the third port, and $||$ indicates an absolute value. Ideally, the amplitude balance and the phase balance are 0 dB and 0 degree, respectively, in the pass band of a SAW filter.

However, in the related art, SAW filters having a balance-to-unbalance conversion function have had a problem in that balance between balanced signal terminals is low.

SUMMARY OF THE INVENTION

In order to overcome the problems described above, preferred embodiments of the present invention provide a surface acoustic wave filter having a balance-to-unbalance conversion function and having high balance between balanced signal terminals.

According to a preferred embodiment of the present invention, a surface acoustic wave filter includes a piezoelectric substrate and a longitudinally coupled resonator filter including three IDTs arranged along a surface acoustic wave propagation direction provided on the piezoelectric substrate. At least one of the three IDTs has a different phase from the other IDTs. An unbalanced terminal and balanced terminals are provided for the longitudinally coupled resonator filter. Reflectors are arranged to sandwich the three IDTs therebetween, and the reflectors are grounded.

Furthermore, according to another preferred embodiment of the present invention, a surface acoustic wave filter includes a piezoelectric substrate and a plurality of longitudinally coupled resonator filters each including three IDTs arranged along a surface acoustic wave propagation direction on the piezoelectric substrate. At least one of the three IDTs has a different phase from the other IDTs. An unbalanced terminal and balanced terminals are provided for the plurality of longitudinally coupled resonator filters. Reflectors are arranged to sandwich the three IDTs therebetween in each of the longitudinally coupled resonator filters, and each of the reflectors are grounded.

Accordingly, in a SAW filter, a longitudinally coupled resonator filter having three IDTs arranged along the SAW propagation direction is provided with an unbalanced terminal and balanced terminals, thus implementing a balance-to-unbalance conversion function. The SAW filter further includes reflectors arranged so that they sandwich the three IDTs therebetween, thus reducing the insertion loss.

The reflectors are grounded, thereby improving balance between the balanced signal terminals while avoiding reduction of characteristics other than balance, such as a transmission characteristic, when a longitudinally coupled resonator filter having three IDTs is used.

In the above-described SAW filter, at least one surface acoustic wave resonator may be connected at least in series or in parallel to the longitudinally coupled resonator filter, thereby increasing the out-of-passband attenuation to improve filtering characteristics.

Each of the reflectors has preferably 20 to 200 electrode fingers. The reflectors each having less than 20 electrode fingers lead to reduction in reflection efficiency for a surface acoustic wave and high insertion loss. On the other hand, the reflectors each having more than 200 electrode fingers make the SAW filter larger in size.

Therefore, the reflectors each having a range of 20 to 200 electrode fingers make it possible to achieve high balance while avoiding reduction of characteristics in the pass band.

Preferably, the pitch between the IDTs and the reflectors is within a range from about 0.4 λR to about 0.6 λR, where λR represents the wavelength of the reflectors. When the pitch between the IDTs and the reflectors is out of this range, an undesirable ripple occurs in the pass band.

The IDT-reflector pitch ranging from about 0.4 λR to about 0.6 λR prevents a ripple of an output signal in the pass band and improves a transmission characteristic.

Preferably, in the longitudinally coupled resonator filter, the end IDTs located beside the center IDT have an inverted phase relative to each other; or, in at least one of the plurality of longitudinally coupled resonator filters, the end IDTs positioned beside the center IDT are phase-reversed relative to each other.

The end IDTs positioned beside the center IDT are phase-reversed relative to each other, leading to a more reliable balance-to-unbalance conversion function.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
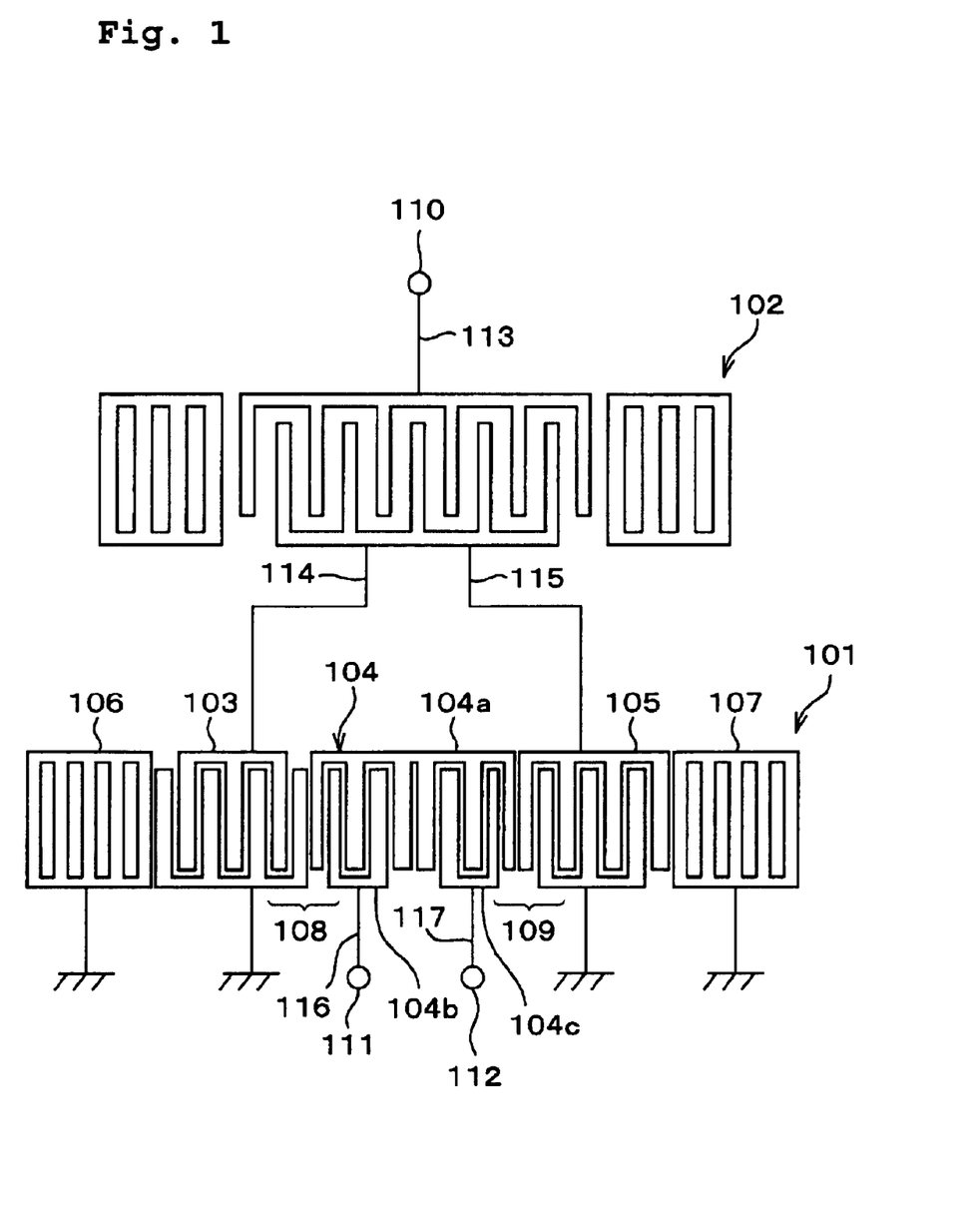
FIG. 1 is a schematic diagram of a SAW filter according to a preferred embodiment of the present invention.

A preferred embodiment of the present invention is now described with reference to FIGS. 1 to 11. FIG. 1 shows the configuration of a SAW filter according to a preferred embodiment of the present invention. This preferred embodiment is discussed in the context of a DCS (digital cellular system) reception filter.

In the SAW filter according to this preferred embodiment, on a piezoelectric substrate (not shown) preferably made of 40±5° Y-cut X-propagating $LiTaO_3$, a longitudinally coupled resonator SAW filter unit 101 and a SAW resonator 102 connected in series to the SAW filter unit 101 are each disposed of an aluminum (Al) electrode (foil) preferably using photolithography.

The SAW filter unit 101 includes a center IDT 104, and IDTs 103 and 105, which sandwich the IDT 104 therebetween from both sides (the left and right sides in FIG. 1) in the SAW propagation direction. The IDTs 103, 104, and 105 define a longitudinally coupled resonator filter having IDTs along the SAW propagation direction.

The IDTs 103, 104, and 105 each have a plurality of electrode finger portions each including a strip base portion (bus bar) and a plurality of electrode fingers extending substantially parallel to each other and extending substantially perpendicularly from one side of the base portion. The electrode finger portions are configured so that the electrode fingers of one electrode finger portion are interleaved with the electrode fingers of another electrode finger portion such that the sides thereof face each other.

In the IDTs 103, 104, and 105, the signal conversion characteristic or the pass band can be determined by setting the length and width of each electrode finger, the pitch between adjacent electrode fingers, and the interdigital length which means the length by which the interleaved electrode fingers face each other.

In the SAW filter unit 101, reflectors 106 and 107 are arranged so as to sandwich the IDTs 103, 104, and 105 therebetween from both sides (the left and right sides in FIG. 1) in the SAW propagation direction. The reflectors 106 and 107 reflect a propagating surface acoustic wave along the SAW propagation direction. The reflectors 106 and 107 each have a pair of substantially parallel bus bars that face each other, and a plurality of substantially parallel electrode fingers interconnecting the bus bars.

As apparent from FIG. 1, the pitch between some electrode fingers (narrower-pitch electrode fingers) at the portion (indicated by a portion 108) where the IDTs 103 and 104 face each other, and the pitch between some electrode fingers (narrower-pitch electrode fingers) at the portion (indicated by a portion 109) where IDTs 104 and 105 face each other are narrower than the pitch between the other electrode fingers of the IDTs 103, 104, and 105. Thus, the insertion loss of the SAW filter can be reduced. Terminals 111 and 112 are balanced signal terminals, and a terminal 110 is an unbalanced signal terminal.

The unbalanced signal terminal 110 is connected to one electrode finger portion of the SAW resonator 102 via a signal line 113. The other electrode finger portion of the SAW resonator 102 is connected to the IDTs 103 and 105 of the SAW filter unit 101 via signal lines 114 and 115, respectively. The SAW resonator 102 further includes reflectors positioned on both sides of the electrode finger portions that are interleaved with each other.

The balanced signal terminals 111 and 112 are connected to the IDT 104 via signal lines 116 and 117, respectively. The IDT 104 is divided into two sections at the center. Thus, the IDT 104 has a symmetrical structure with respect to an imaginary line, as the axis of symmetry, which passes through the center of the IDT 104 and which is substantially perpendicular to the SAW propagation direction.

The IDT 104 has an electrode finger portion 104a including an even number of electrode fingers, and the electrode finger portion 104a is provided with a pair of electrode fingers, which extends in the same direction, at the center thereof in the SAW propagation direction. The imaginary line passes between the pair of electrode fingers. The electrode finger portion 104a is floating.

The IDT 104 further has a pair of electrode finger portions 104b and 104c including electrode fingers which are interleaved with the electrode fingers of the electrode finger portion 104a so that the sides of the electrode fingers face each other. The electrode finger portions 104b and 104c are electrically isolated from each other, and are symmetric with respect to the imaginary line as the axis of symmetry. The balanced signal terminals 111 and 112 are connected to the electrode finger portions 104b and 104c, respectively.

The IDTs 103 and 105 are symmetric with respect to a center point of the IDT 104 on the imaginary line as the point of symmetry. In other words, the IDTs 103 and 105 are reversed with respect to each other. At least one of the IDTs 103, 104, and 105 is out of phase relative to the others, that is, the IDTs 103 and 105 are phase-reversed relative to each other. Then, the SAW filter unit 101 can implement a balance-to-unbalance conversion function. Each of the reflectors 106 and 107 are grounded in the SAW filter having the SAW filter unit 101.

Where the wavelength defined by the pitch between the narrower-pitch electrode fingers is indicated by $\lambda I_2$ (indicated by the portions 108 and 109 in FIG. 1), and the wavelength defined by the pitch between the other electrode fingers is indicated by $\lambda I_1$, an example of the specific design of the SAW filter unit 101 is as follows:
interdigital length W: 59.6 $\lambda I_1$;
number of electrode fingers of the IDT 103: 19(3)
number of electrode fingers of the IDT 104: (3)26(3)
number of electrode fingers of the IDT 105: (3)19
(the number in parentheses indicates the number narrower-pitch electrode fingers);
IDT wavelength $\lambda I_1$: 2.15 $\mu$m
$\lambda I_2$: 1.91 $\mu$m;
reflector wavelength $\lambda R$: 2.18 $\mu$m;
number of electrode fingers of reflector: 100;
pitch between IDTs: 0.500 $\lambda I_2$;
pitch between IDT and reflector: 0.470 $\lambda R$;
duty: 0.67 (for IDT and reflector); and
electrode thickness: 0.096 $\lambda I_1$.

An example of the specific design of the SAW resonator 102 is as follows:
interdigital length W: 60.9$\lambda$;
number of electrode fingers of IDT: 150;
wavelength $\lambda$ (for IDT and reflector): 2.10 $\mu$m;
number of electrode fingers of reflector: 30;
pitch between IDT and reflector: 0.50$\lambda$;
duty: 0.67 (for IDT and reflector); and
electrode thickness: 0.098$\lambda$.

As used herein, "pitch" means the center-to-center distance between two adjacent electrode fingers in the width direction thereof.

Figure 2:
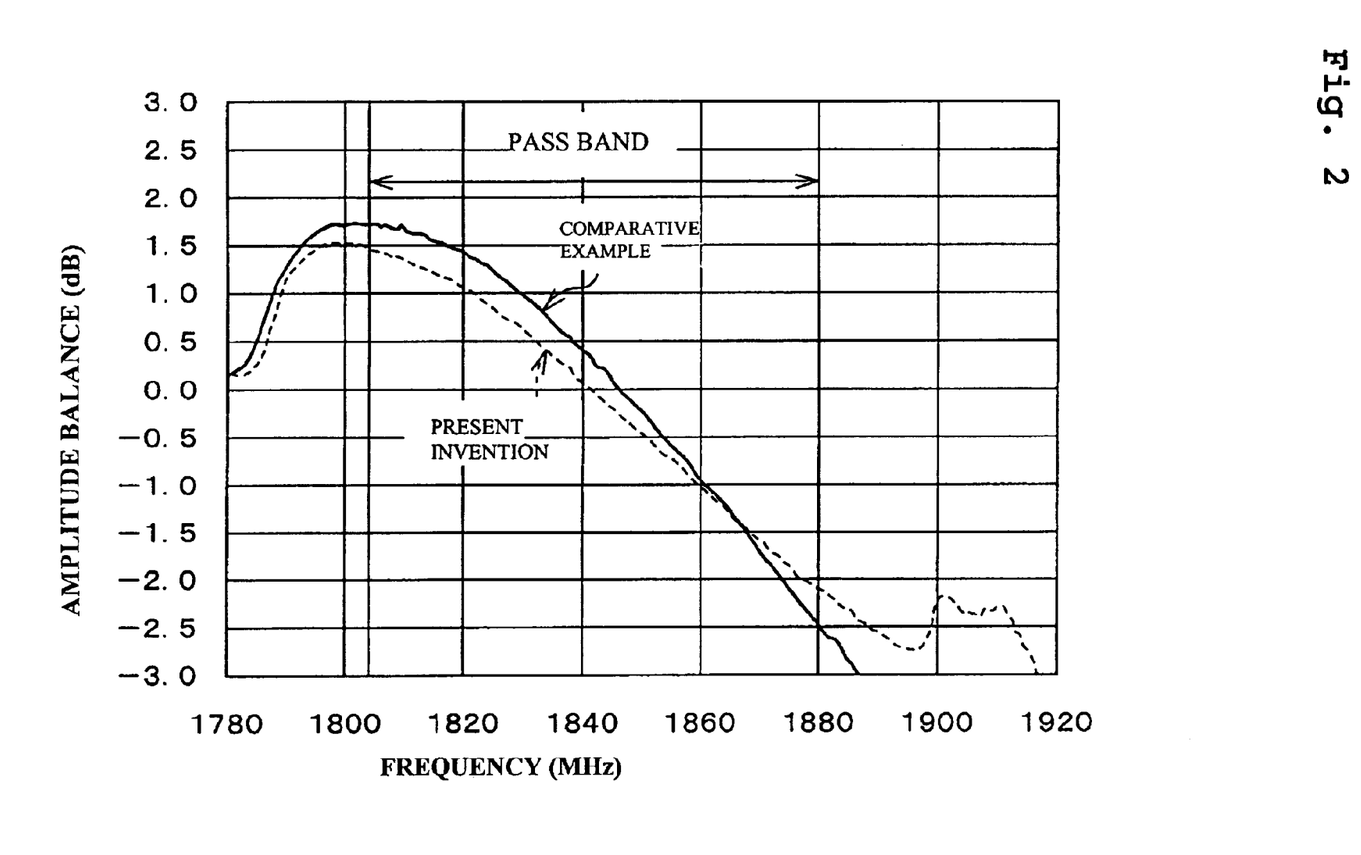
FIG. 2 is a graph showing the difference in frequency versus amplitude balance between the SAW filter of a preferred embodiment of the present invention and a SAW filter of a comparative example.
Figure 3:
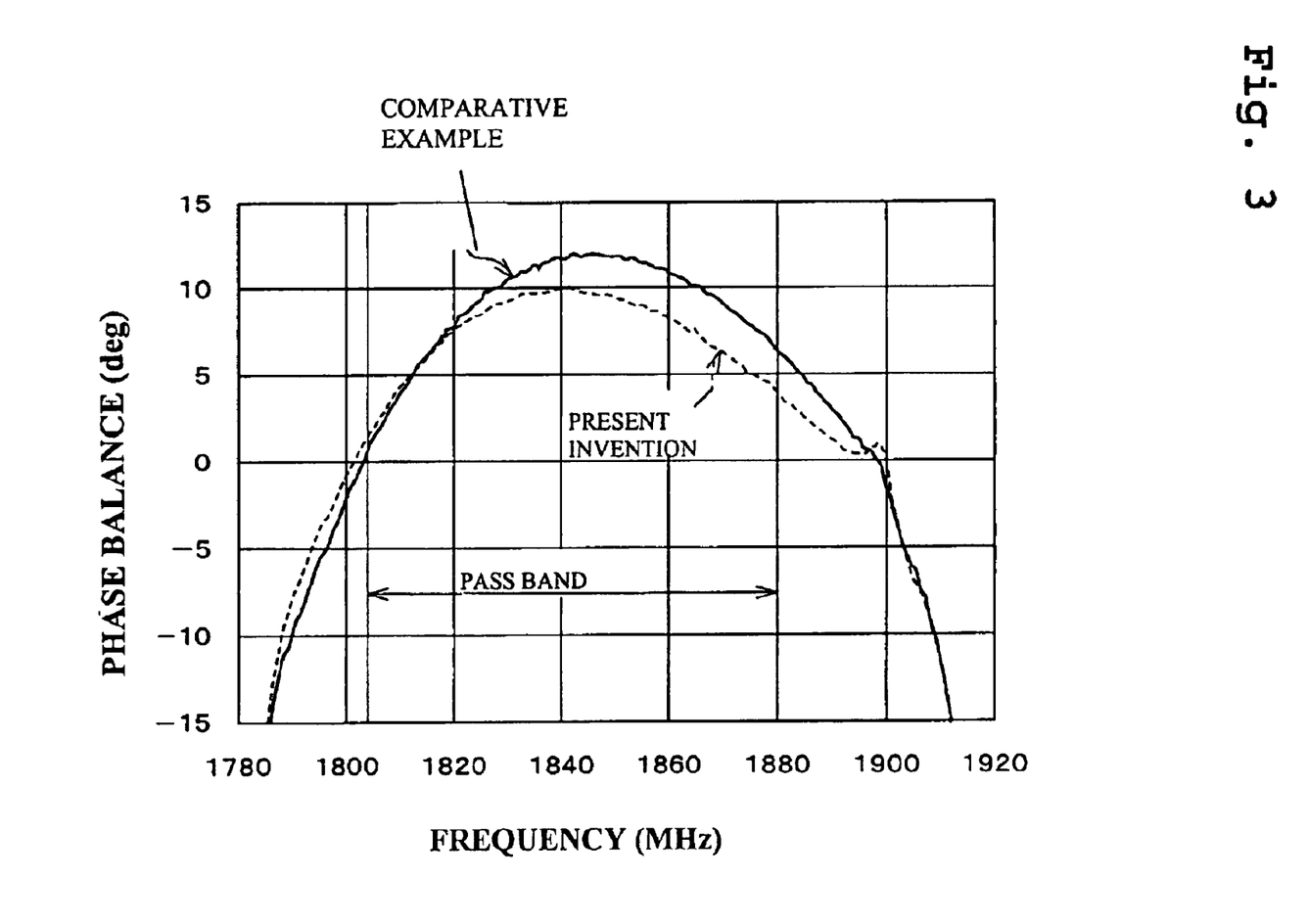
FIG. 3 is a graph showing the difference in frequency versus phase balance between the SAW filter of a preferred embodiment of the present invention and the SAW filter of the comparative example.
Figure 4:
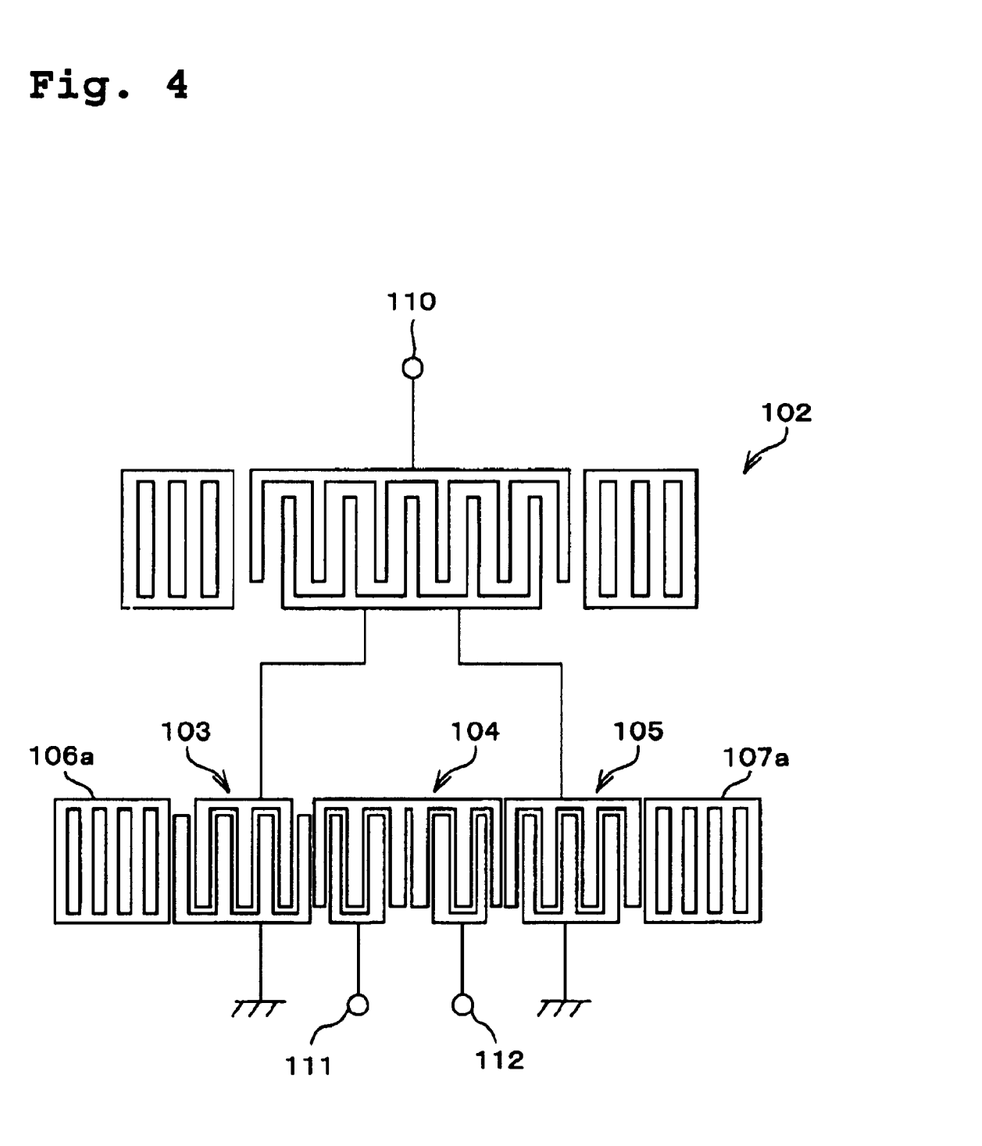
FIG. 4 is a schematic diagram of the SAW filter of the comparative example.
Figure 5:
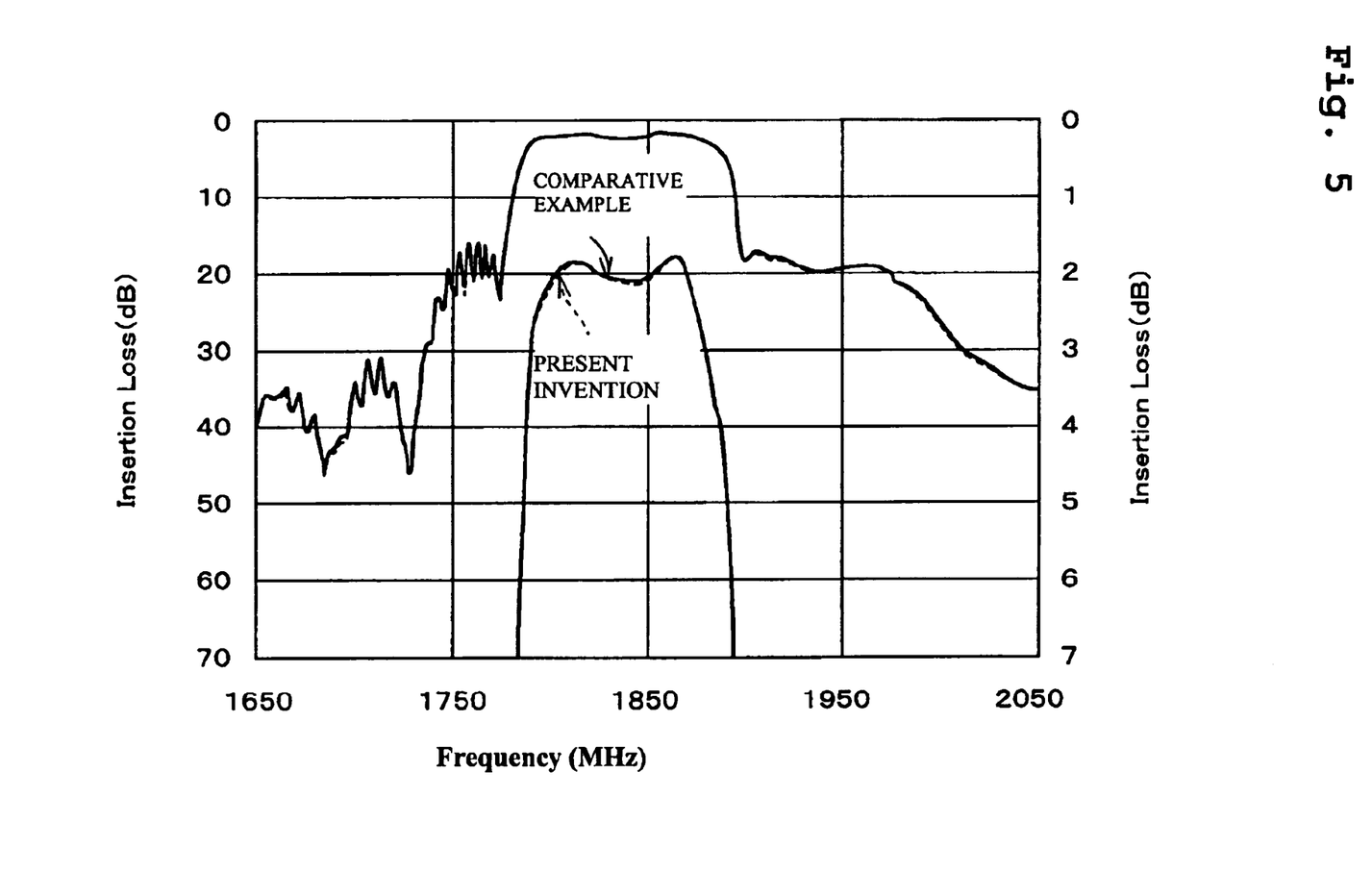
FIG. 5 is a graph showing the difference in frequency-amplitude characteristic between the SAW filter of a preferred embodiment of the present invention and the SAW filter of the comparative example.

The operations and advantages of the SAW filter in this preferred embodiment are now described. FIGS. 2 and 3 are graphs showing the amplitude balance and the phase balance between the balanced signal terminals, respectively, in the frequency characteristic of the SAW filter in this preferred embodiment. For comparison, the amplitude balance and the phase balance of a SAW filter of a comparative example shown in FIG. 4 are also shown in FIGS. 2 and 3, respectively. The SAW filter of the comparative example shown in FIG. 4 is the same as the SAW filter in this preferred embodiment, except that reflectors 106a and 107a are not grounded. FIG. 5 depicts the frequency-amplitude characteristics of the SAW filter in this preferred embodiment and the SAW filter of the comparative example. The frequency of the pass band of a DCS reception filter ranges from about 1805 MHz to about 1880 MHz.

The amplitude balance in this range is about −2.50 dB to about +1.75 dB (having a deviation of about 4.25 dB) for the comparative example, while it is about −2.20 dB to about +1.50 dB (having a deviation of about 3.70 dB) for this preferred embodiment. The smaller the deviation, the higher the amplitude balance, and in this preferred embodiment, therefore, the amplitude balance is about 0.55 dB higher.

The phase balance is about +1.0° to about +12.5° (having a deviation of about 11.5°) for the comparative example, while it is about +2.0° to about +10.0° (having a deviation of about 8.0°) for this preferred embodiment. The smaller the deviation, the higher the phase balance, and in this preferred embodiment, therefore, the phase balance is about 3.5° higher. The SAW filter in this preferred embodiment exhibits substantially no change in the amplitude characteristic. In this preferred embodiment, therefore, balance can be improved while avoiding reduction in amplitude characteristic. One possible reason for low balance is that a floating electrode which is not a signal electrode or is not grounded would cause an unstable potential.

According to this preferred embodiment, as described above, the reflectors 106 and 107 are grounded in the SAW filter having a balance-to-unbalance conversion function shown in FIG. 1, and therefore has higher balance between the balanced signal terminals 111 and 112 than the SAW filter of the comparative example.

Figure 6:
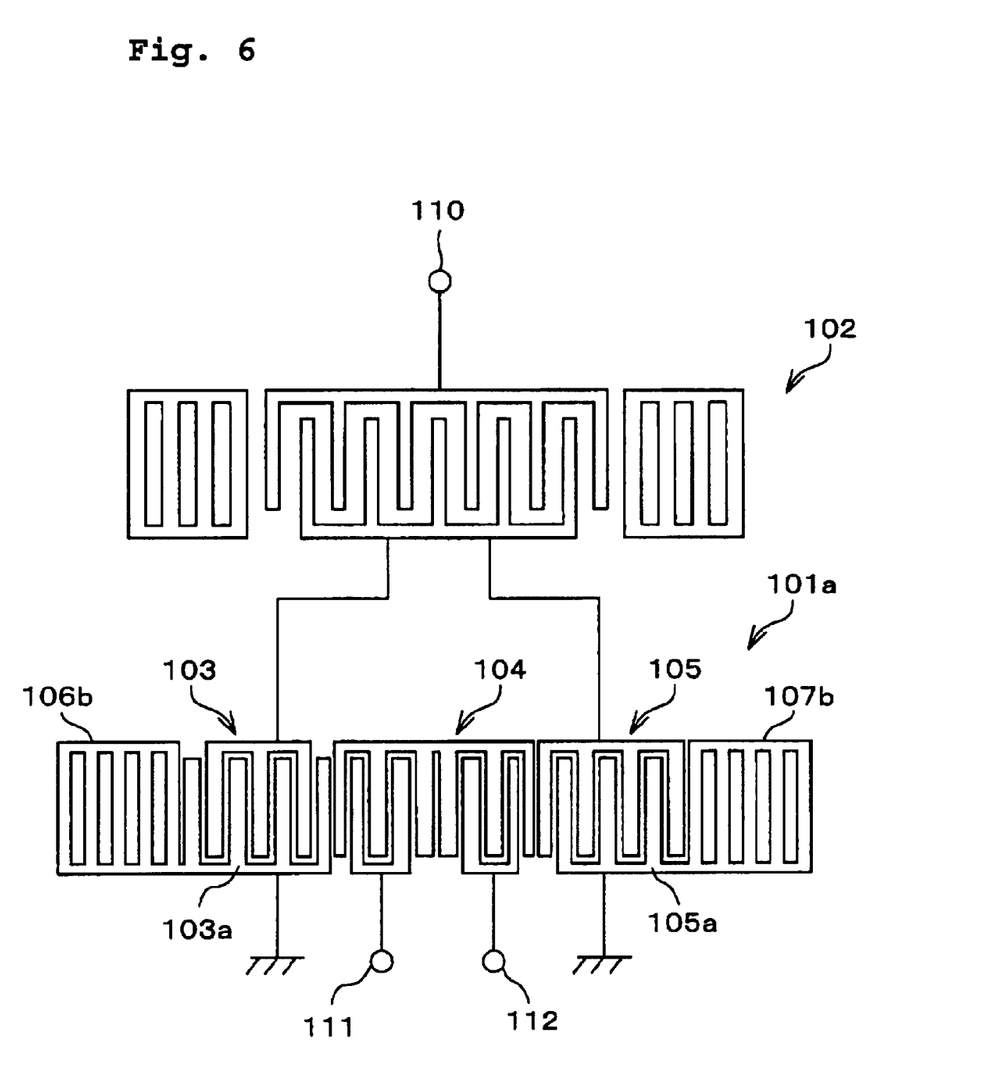
FIG. 6 is a schematic diagram of a modification of the SAW filter according to a preferred embodiment of the present invention.

According to various preferred embodiments of the present invention, as shown in FIG. 6, the SAW filter may be configured such that reflectors 106b and 107b are respectively connected to bus bars 103a and 105a of the IDTs 103 and 105 adjacent to the reflectors 106b and 107b, which are grounded, so that the reflectors 106b and 107b are also grounded. In this case, advantages similar to those of the present invention can be achieved. The reflectors 106b and 107b can be grounded without any additional electrode pad being provided on the piezoelectric substrate. Thus, it is not necessary to increase the size of the SAW filter in order to achieve the advantages of preferred embodiments of the present invention.

The present invention has been described in the context of a three-IDT longitudinally coupled resonator filter having three IDTs, but the advantages of the present invention would be achieved by a longitudinally coupled resonator filter having any number of IDTs. Longitudinally coupled resonator filters of the multi-electrode type, such as two-IDT or five-IDT or more, would achieve advantages similar to those of the present invention.

However, a multi-electrode filter has the disadvantage that more chip wiring lines are required on the piezoelectric substrate, leading to a complex pattern layout. In this view, a three-IDT longitudinally coupled resonator filter, as described with respect to the foregoing preferred embodiment, is preferable.

Although the SAW resonator 102 is connected in series to the SAW filter unit 101 in the aforementioned preferred embodiment, a SAW resonator may be connected in parallel to the SAW filter unit 101, or SAW resonators may be connected both in series and in parallel to the SAW filter unit 101, in order to achieve the advantages of the present invention. The advantages of the present invention would also be achieved by the configuration in which a SAW resonator is not connected to the SAW filter unit 101, in which case the out-of-passband attenuation is not sufficient. Therefore, preferably, a SAW resonator is connected to the SAW filter unit 101.

Figure 7:
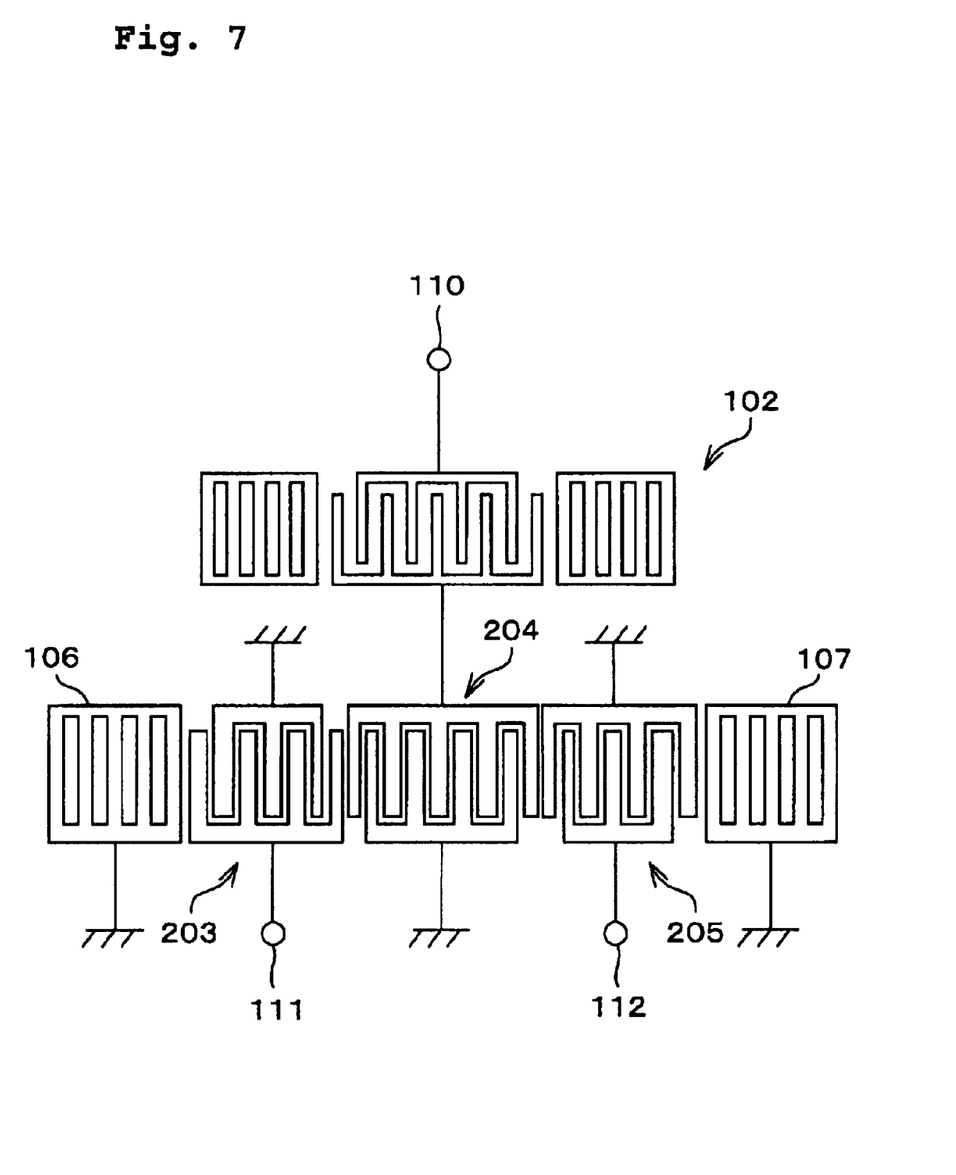
FIG. 7 is a schematic diagram of another modification of the SAW filter according to a preferred embodiment of the present invention.
Figure 8:
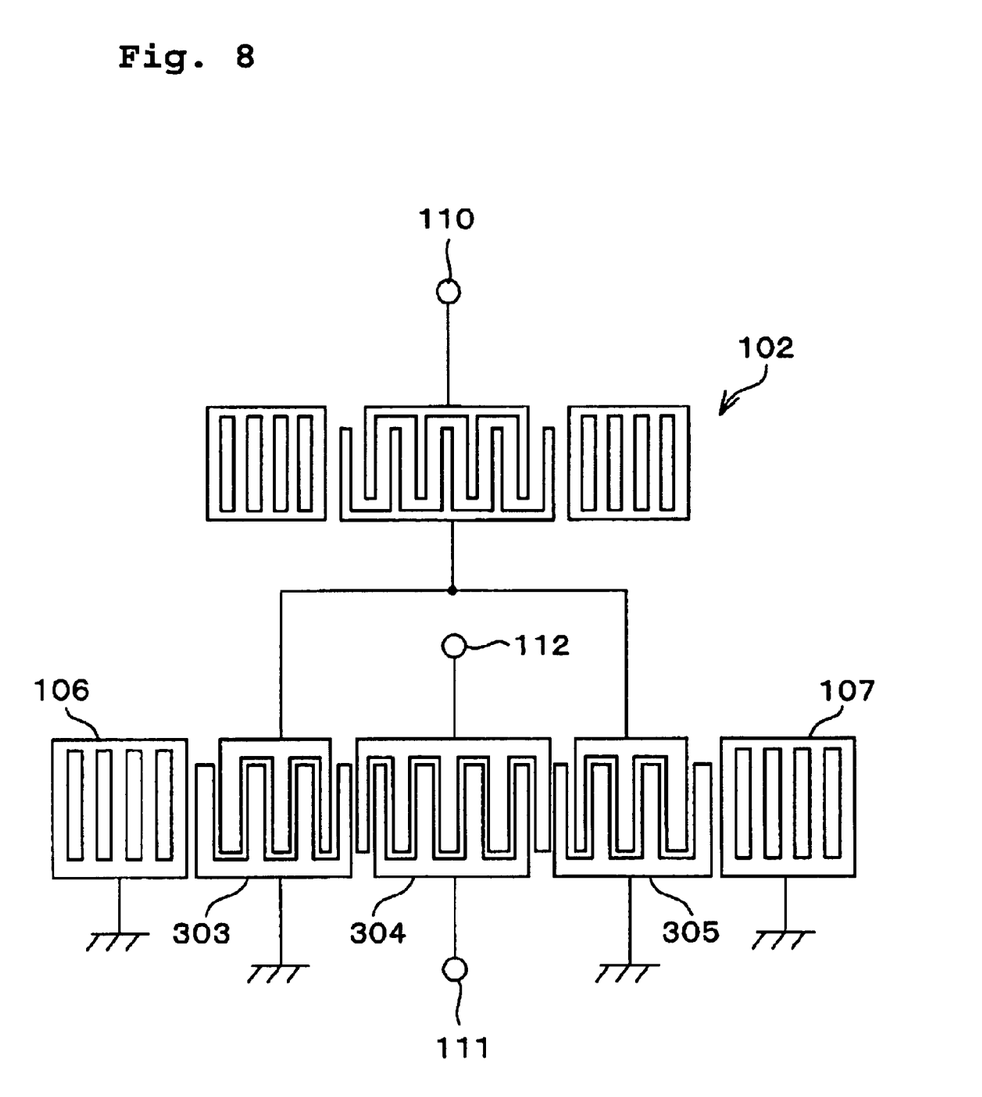
FIG. 8 is a schematic diagram of still another modification of the SAW filter according to a preferred embodiment of the present invention.
Figure 9:
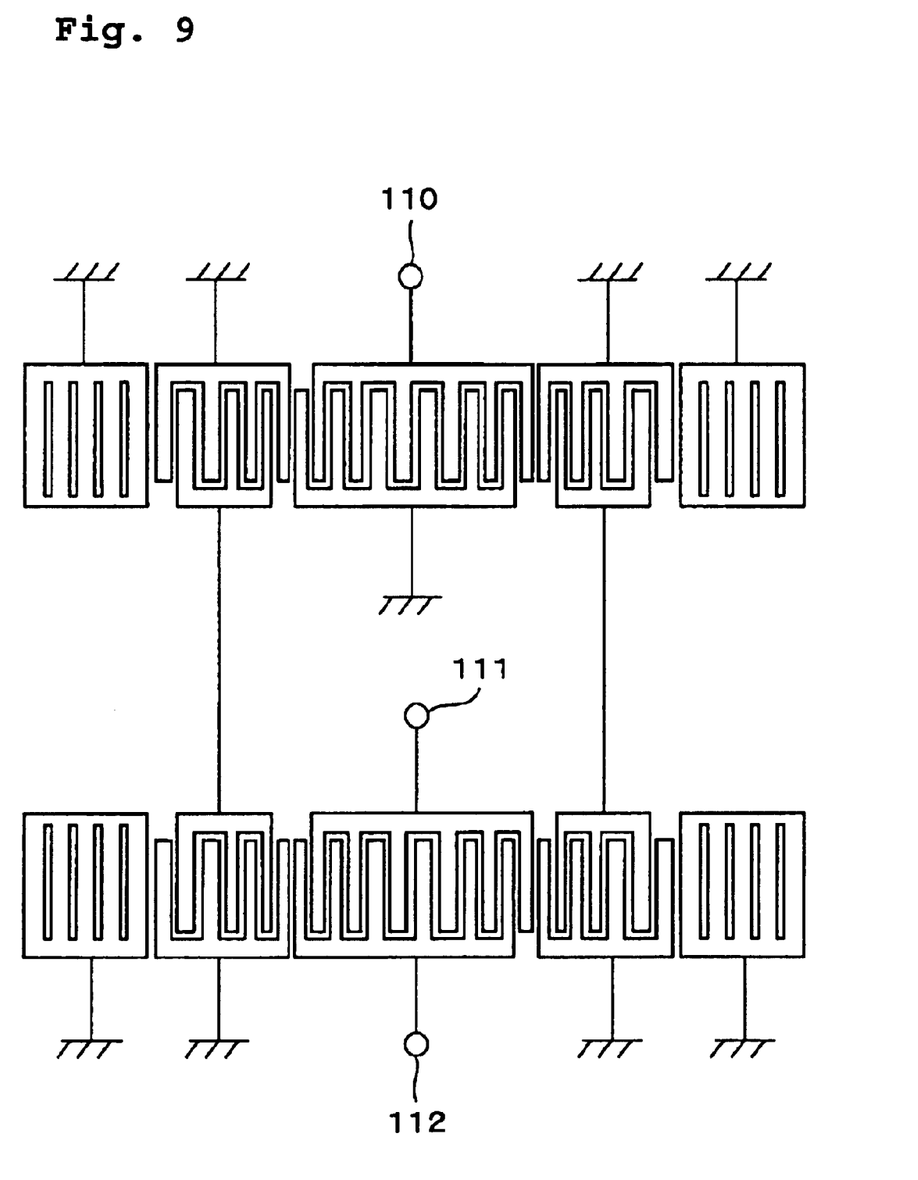
FIG. 9 is a schematic diagram of still another modification of the SAW filter according to a preferred embodiment of the present invention.

Some modified SAW filters having a balance-to-unbalance conversion function can also achieve the advantages of various preferred embodiments of the present invention. For example, as shown in FIG. 7, a three-IDT longitudinally coupled resonator filter may be configured such that the IDTs 203 and 205 are connected to the balanced signal terminals 111 and 112, respectively. As shown in FIG. 8, a SAW filter may be configured such that the balanced signal terminals 111 and 112 are connected to both electrode finger portions of the center IDT 304, respectively. As shown in FIG. 9, two three-IDT longitudinally coupled resonator filters may be cascade-connected. Such SAW filters would achieve advantages similar to those of various preferred embodiments of the present invention.

Figure 10:
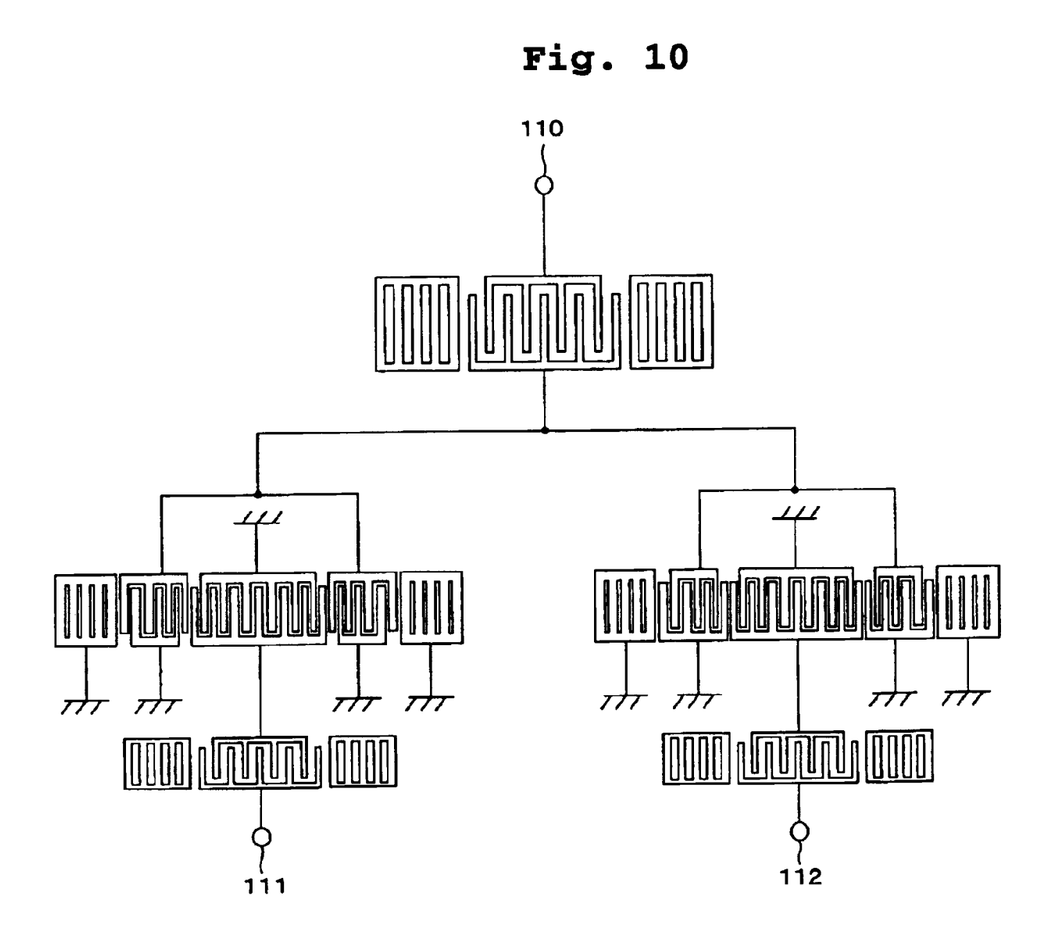
FIG. 10 is a schematic diagram of still another modification of the SAW filter according to a preferred embodiment of the present invention
Figure 11:
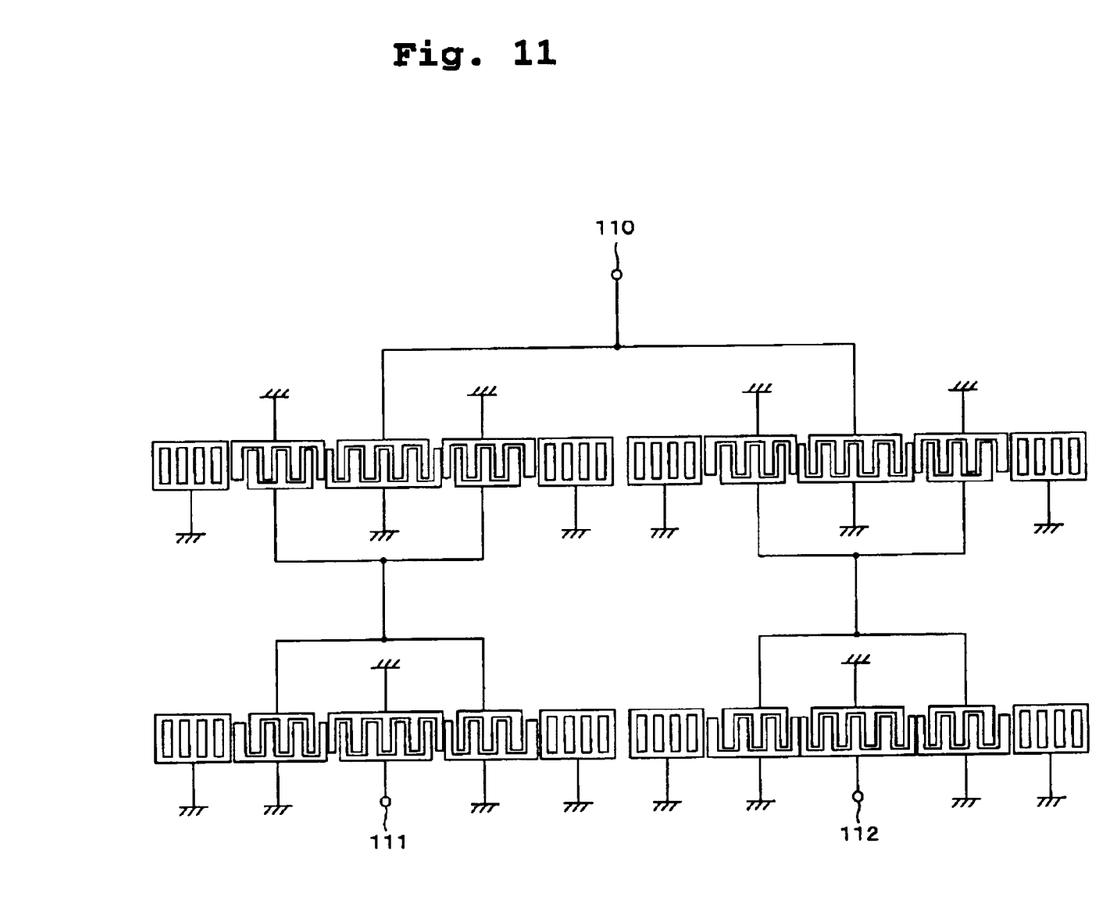
FIG. 11 is a schematic diagram of still another modification of the SAW filter according to a preferred embodiment of the present invention.

Moreover, as shown in FIG. 10, a SAW filter having a balance-to-unbalance conversion function may be formed of two three-IDT longitudinally coupled resonator filters. The two three-IDT longitudinally coupled resonator filters may be cascade-connected, as shown in FIG. 11. In either case, advantages similar to those of the foregoing preferred embodiments can be achieved.

Reflectors are grounded, thereby, advantageously, preventing pyroelectric damage at a portion where an IDT and a reflector are adjacent to each other.

In the illustrated preferred embodiments, a piezoelectric substrate made of 40±5° Y-cut X-propagating $LiTaO_3$ is preferably used. However, the present invention is not limited thereto as long as the advantages of the present invention are achieved. A piezoelectric substrate made of 64° to 72° Y-cut X-propagating $LiNbO_3$, 41° Y-cut X-propagating $LiNbO_3$, or other suitable substrate may be used to achieve advantages similar to those of the present invention.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave filter comprising:
a piezoelectric substrate;
a longitudinally coupled resonator filter provided on the piezoelectric substrate, said longitudinally coupled resonator filter including at least three interdigital transducers arranged along a surface acoustic wave propagation direction, at least one of the at least three interdigital transducers has a different phase from the other interdigital transducers;
an unbalanced terminal and a balanced terminal which are provided for the longitudinally coupled resonator filter; and
reflectors arranged to sandwich the at least three interdigital transducers therebetween in the longitudinally coupled resonator filter, each of said reflectors being grounded.

2. A surface acoustic wave filter according to claim 1, wherein the piezoelectric substrate is one of a 40±5° Y-cut X-propagating $LiTaO_3$ substrate, a 64° to 72° Y-cut X-propagating $LINbO_3$ substrate, and a 41° Y-cut X-propagating $LiNbO_3$ substrate.

3. A surface acoustic wave filter according to claim 1, wherein at least one surface acoustic wave resonator is connected at least in series or in parallel to the longitudinally coupled resonator filter.

4. A surface acoustic wave filter according to claim 1, wherein each of the reflectors has 20 to 200 electrode fingers.

5. A surface acoustic wave filter according to claim 1, wherein the pitch between the interdigital transducers and the reflectors is within a range from about 0.4 AR to about 0.6 AR, where AR represents the wavelength of the reflectors.

6. A surface acoustic wave filter according to claim 1, wherein the interdigital transducers located at both sides of the center interdigital transducer among the at least three interdigital transducers in the longitudinally coupled resonator filter have an inverted phase relative to each other.

7. A surface acoustic wave filter according to claim 1, wherein the at least three interdigital transducers include electrode fingers which are arranged such that a pitch between a first group of the electrode fingers at a portion where the at feast three interdigital electrodes face each other is narrower than a pitch between the remaining electrode fingers of the at least three interdigital transducers.

8. A surface acoustic wave filter comprising:
a piezoelectric substrate;
a plurality of longitudinally coupled resonator filters provided on the piezoelectric substrate, each filter including at least three interdigital transducers arranged along a surface acoustic wave propagation direction, at least one of the at least three interdigital transducers has a different phase from the other interdigital transducers;
an unbalanced terminal and a balanced terminal which are provided for the plurality of longitudinally coupled resonator filters; and
reflectors arranged to sandwich the at least three interdigital transducers therebetween in each of the longitudinally coupled resonator filters, each of said reflectors being grounded.

9. A surface acoustic wave filter according to claim 8, wherein the at least three interdigital transducers include electrode fingers which are arranged such that a pitch between a first group of the electrode fingers at a portion where the at least three interdigital electrodes face each other is narrower than a pitch between the remaining electrode fingers of the at least three interdigital transducers.

10. A surface acoustic wave filter according to claim 8, wherein the piezoelectric substrate is one of a 40±5° Y-cut X-propagating $LiTaO_3$ substrate, a 64° to 72° Y-cut X-propagating $LiNbO_3$ substrate, and a 41° Y-cut X-propagating $LiNbO_3$ substrate.

11. A surface acoustic wave fitter according to claim 8, wherein at least one surface acoustic wave resonator is connected at least in series or in parallel to at least one of the longitudinally coupled resonator filters.

12. A surface acoustic wave filter according to claim 8, wherein each of the reflectors has 20 to 200 electrode fingers.

13. A surface acoustic wave filter according to claim 8, wherein the pitch between the interdigital transducers and the reflectors is within a range from about 0.4 AR to about 0.6 AR, where AR represents the wavelength of the reflectors.

14. A surface acoustic wave filter according to claim 8, wherein the interdigital transducers located at both sides of the center interdigital transducer among the at least three interdigital transducers in the longitudinally coupled resonator filter have an inverted phase relative to each other.

15. A surface acoustic wave filter according to claim 10, wherein the at least three interdigital transducers include electrode fingers which are arranged such that a pitch between a first group of the electrode fingers at a portion where the at least three interdigital electrodes face each other is narrower than a pitch between the remaining electrode fingers of the at least three interdigital transducers.

16. A surface acoustic wave filter according to claim 8, wherein the plurality of longitudinally coupled resonator filters are cascade-connected.

17. A surface acoustic wave filter according to claim 11, wherein the at least three interdigital transducers include electrode fingers which are arranged such that a pitch between a first group of the electrode fingers at a portion where the at least three interdigital electrodes face each other is narrower than a pitch between the remaining electrode fingers of the at least three interdigital transducers.

18. A surface acoustic wave filter according to claim 12, wherein the at least three interdigital transducers include electrode fingers which are arranged such that a pitch between a first group of the electrode fingers at a portion where the at least three interdigital electrodes face each other is narrower than a pitch between the remaining electrode fingers of the at least three interdigital transducers.

19. A surface acoustic wave filter according to claim 13, wherein the at least three interdigital transducers include electrode fingers which are arranged such that a pitch between a first group of the electrode fingers at a portion where the at least three interdigital electrodes face each other is narrower than a pitch between the remaining electrode fingers of the at least three interdigital transducers.

20. A surface acoustic wave filter according to claim 14, wherein the at least three interdigital transducers include electrode fingers which are arranged such that a pitch between a first group of the electrode fingers at a portion where the at least three interdigital electrodes face each other is narrower than a pitch between the remaining electrode fingers of the at least three interdigital transducers.

21. A surface acoustic wave filter according to claim 16, wherein the at least three interdigital transducers include electrode fingers which are arranged such that a pitch between a first group of the electrode fingers at a portion where the at least three interdigital electrodes face each other is narrower than a pitch between the remaining electrode fingers of the at least three interdigital transducers.

* * * * *